(12) United States Patent
Choi (10) Patent No.: US 6,583,505 B2
(45) Date of Patent: Jun. 24, 2003

(54) ELECTRICALLY ISOLATED POWER DEVICE PACKAGE

(75) Inventor: Kang Rim Choi, Cupertino, CA (US)

(73) Assignee: Ixys Corporation, Santa Clara, CA (US)

(*) Notice: Subject to any disclaimer, the term of this patent is extended or adjusted under 35 U.S.C. 154(b) by 0 days.

(21) Appl. No.: 10/099,137

(22) Filed: Mar. 13, 2002

(65) Prior Publication Data

US 2002/0171134 A1 Nov. 21, 2002

Related U.S. Application Data (60) Provisional application No. 60/288,672, filed on May 4, 2001.

(51) Int. Cl.[7] .................. H01L 23/04; H01L 23/28; H01L 23/10; H01L 23/34
(52) U.S. Cl. .............. 257/730; 257/796; 257/706; 257/707
(58) Field of Search .................. 257/730, 706, 257/707, 711, 796, 712, 276, 275, 678; 361/381

(56) References Cited

U.S. PATENT DOCUMENTS 5,637,922 A * 6/1997 Fillion et al. ............... 257/728
5,783,466 A * 7/1998 Takahashi et al. .......... 438/122

* cited by examiner

*Primary Examiner*—Amir Zarabian
*Assistant Examiner*—Kiesha Rose
(74) *Attorney, Agent, or Firm*—Townsend and Townsend and Crew LLP (57) ABSTRACT

A packaged power device includes a substrate including a first conductive layer, a second dielectric layer, and a third conductive layer. The first conductive layer is bonded to the second dielectric layer, and the second dielectric layer is bonded to the third conductive layer. The first and third conductive layers are electrically isolated from each other. The substrate has a lower surface. A semiconductor die is bonded to the first conductive layer of the substrate. A plastic package encloses the die and has a lower surface. A curved backside includes the lower surfaces of the plastic package and substrate.

22 Claims, 9 Drawing Sheets

ELECTRICALLY ISOLATED POWER DEVICE PACKAGE

CROSS-REFERENCES TO RELATED APPLICATIONS

This application claims priority to U.S. Provisional Patent Application No. 60/288,672, filed on May 4, 2001, which is incorporated by reference herein for all purposes.

BACKGROUND OF THE INVENTION

This invention relates to electronic devices, and more particularly to a packaged power semiconductor device with a metal back plate that is electrically isolated from the terminals of the device.

Electronic semiconductor device technology continues to rapidly advance, producing devices that achieve heretofore unattainable operating speeds, packing density, and high-temperature compatibility. This last characteristic, high-temperature compatibility, is one of more important features. High-temperature environments as well as high-power and high frequency applications are becoming increasingly important. The ability of electronics to withstand high-temperature environments such as gas-turbines, automotive engine compartments, materials handling and fabrication equipment, and aircraft subsystems makes possible many historically impractical electronic applications for these environments.

Many such high-power, high-temperature electronics applications inherently limit the ability to dissipate heat and power generated by the electronics. Thermal and power management as well as environmental protection of the electronics are therefore handled entirely by the electronics packaging. As a result, typical high-performance packaging criteria include mechanical strength, high thermal conductivity, close matching of device and package thermal expansion coefficients, low dielectric constant for accommodation of high frequency devices, and environmental protection, such as hermetic sealing.

In designing such packages, thermal management is important—especially at high power generation levels which increase the amount of heat created. Heat decreases the performance and operating life of the transistor. Moreover, heat generated at the collector-base junction can create a temperature buildup which may eventually cause the device to short-circuit.

The power device may be mounted on a thermally conductive pad which acts as a heatsink and dissipates the heat generated by the power device. In order to prevent electrical losses, however, the thermally conductive pad must also be electrically insulating. Hence, a thermally conducting, electrically insulating material, e.g., ceramic, is used for the mounting pad.

BRIEF SUMMARY OF THE INVENTION

In one embodiment, a packaged power device includes a substrate including a first conductive layer, a second dielectric layer, and a third conductive layer. The first conductive layer is bonded to the second dielectric layer, and the second dielectric layer is bonded to the third conductive layer. The first and third conductive layers are electrically isolated from each other. The substrate has a lower surface. A semiconductor die is bonded to the first conductive layer of the substrate. A plastic package encloses the die and has a lower surface. A curved backside includes the lower surfaces of the plastic package and substrate.

The curved backside of the device is attached to a heatsink to dissipate power generated by the power device and is configured to expand toward the heatsink during the operation of the power device, so that heatsink is in contact substantially with the entire backside of the power device. The backside of the power device includes a center portion directly underlying the die, a first outer portion extending outward from the center portion in a first direction and a second outer portion extending outward from the center portion in a second direction, wherein the center portion of the backside is substantially flat. The center portion of the curved backside of the device overlies flatly against a heatsink to dissipate power generated by the power device, and the first and second outer portions of the backside are provided above the heatsink without contacting the heatsink.

The power device is clipped or screwed to the heat sink. The power device is solder bonded to the heat sink. The center portion of the backside is solder bonded to the heatsink and the first and second outer portions are not solder bonded to the heatsink. The substrate is a direct bonded metal substrate. The substrate is a direct copper bonded substrate, wherein the first and third conductive layers are copper layers. The substrate is a direct aluminum bonded substrate, wherein the first and third conductive layers are aluminum layers.

The power device of claim 1, wherein the package has a length N1 and the backside has a pitch N2, wherein the pitch N2 is no more than 0.002×N1. The pitch is a vertical distance from a center of the backside to an edge of the backside. The power device of claim 1, wherein the backside has a pitch that is no more than 0.001 inch.

In another embodiment, a method of manufacturing a packaged power device includes providing a substrate having a curved surface; bonding a semiconductor die on the curved substrate; and forming a plastic package to enclose the die.

DETAILED DESCRIPTION OF THE INVENTION

Embodiments of the present invention use direct bonded metal substrates and plastic packages for power devices, thereby providing a simplified construction of a power device package for mass production with automation, reduced costs, reduced thermal fatigue problem associated with multi-layered packages, reduced thermal resistance of the package, reduced thermal fatigue effect, and the like.

As used herein, the term "direct bonded metal substrate" refers to a substrate comprising a dielectric layer and a conductive layer bonded to each other by heating them to a temperature between the eutectic and melting temperatures of the conductive layer. The conductive layers may be copper, aluminum, or the like. The dielectric layer may be aluminum nitride, alumina, or other ceramic materials. Examples of the direct bonded metal substrate include a direct bonded copper (DCB) or direct copper bonded (DBC) substrate, a direct aluminum bonded (DAB) substrate, and the like. Generally, the direct bonded metal substrate has two conductive layers with a dielectric layer provided therebetween. A more detail description of the direct bonded metal substrate will be provided later.

As used herein, the term "power device" refers to a semiconductor device that is used to regulate flow of electricity, e.g., a three terminal device such as insulated gate bipolar transistors (IGBTs), metal-oxide semiconductor field effect transistors (MOSFETs), silicon controlled rectifiers (SCRs), or the like. The term "power device" also refers to a packaged power device including a semiconductor device, one or more leads, a package, a substrate, and other components generally found in a packaged power device.

Figure 1:
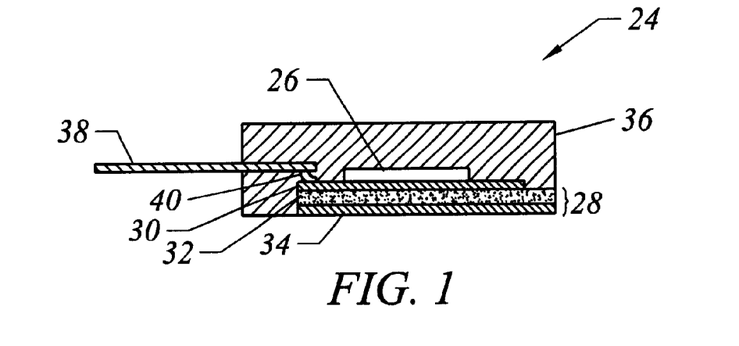
FIG. 1 illustrates a cross sectional view of a power device according to one embodiment of the present invention.

FIG. 1 depicts a simplified cross-sectional view of a packaged power device 24 according to one embodiment of the present invention. In the present exemplary embodiment, the power device has a flat backside. In another embodiment, the power device has a curved backside, as will be explained in greater detail later. A power semiconductor die 26 is solder bonded to a direct bonded metal substrate 28, e.g., a direct copper bonded (DCB or DBC) substrate or a direct aluminum bonded (DAB) substrate. The die defines one or more three terminal devices, such as insulated gate bipolar transistors (IGBTs), metal-oxide semiconductor field effect transistors (MOSFETs), silicon controlled rectifiers (SCRs), or the like ("power device").

The substrate 28 includes a first conductive layer 30, a dielectric layer 32, and a second conductive layer 34. A layer of encapsulant 36 is formed over the die 26, the substrate 28, and the device leads 38 that is soldered to the first conductive layer 30, as indicated by a solder layer 40. In one embodiment, the backside of the device 24 includes a backside of the encapsulant 36 and a backside of the substrate 28. In one embodiment, the backsides of the encapsulant and the substrate are flushed, respectively, to provide a substantially flat surface.

For purposes of illustration of the present exemplary embodiment, the substrate 28 is assumed to be a DCB having copper plates as the first and second conductive layers 30 and 34. One or both of the copper layers 30 and 34 may be tinned or plated. Alternatively, the substrate 28 may be a DAB substrate having aluminum plates as the first and second conductive layers 30 and 34.

The dielectric layer (also referred to as a second dielectric layer) 32 may be alumina, aluminum nitride, beryllium oxide, or other dielectric materials suitable for direct bonded metal substrate fabrication. For purposes of illustration, the dielectric layer is described as an alumina ceramic in the present embodiment. Each layer of copper is about 0.0118 inch (0.30 mm) thick, and the alumina layer is about 0.0248 inch (0.630 mm) thick, making the DCB substrate about 0.0484 inch (1.23 mm) thick overall. However, the substrate may be thicker or thinner in other embodiments.

Figure 2:
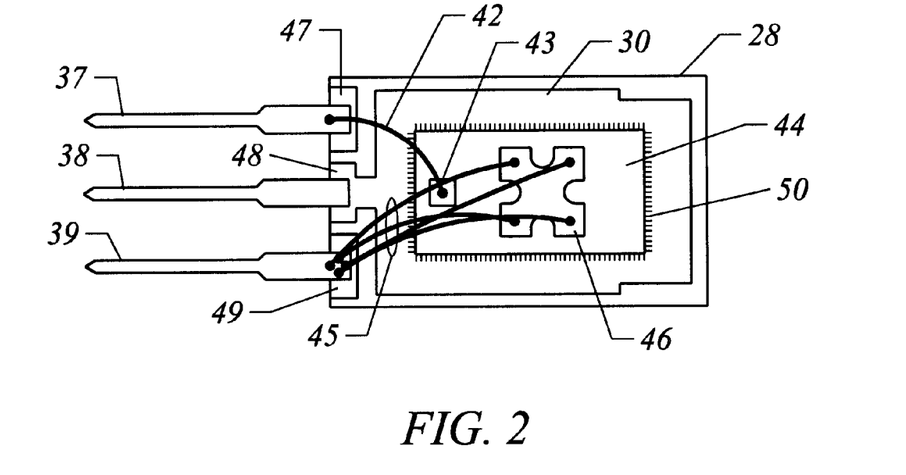
FIG. 2 illustrates a top plan view of the power device of FIG. 1 with a plastic package delayered according to one embodiment of the present invention.

FIG. 2 shows a simplified top plan view of the device 24 with the encapsulant layer removed. A plurality of device leads 37, 38, and 39 are coupled to the DCB substrate 28. The first copper layer 30 has been patterned to provide a plurality of lead connecting pads (or conductive blocks) 47, 48, and 49, whereon the leads are solder bonded. The first lead 37 is wire bonded to a first terminal 43 of a three terminal device 44, such as the gate of an IGBT die, via a wire 42. The second lead 39 is wire bonded to a second terminal 46 of the three terminal device, such as the emitter of an IGBT die, via a wire 45. The third lead 38 is soldered to the first copper layer 30, which is electrically coupled to the collector of the three terminal device, which also is soldered to the first copper layer, as indicated by a solder layer 50. Other devices, such as a field-effect transistor (FET), which is also a three terminal device may be used.

In one embodiment, power IGBTs or FETs (or power devices) are designed to handle voltages up to 3,000 volts and handle currents of over 100 amperes at 70 volts. Therefore, power dissipation is an important consideration for the power devices, as well as electrical isolation of the second copper layer from the die 26 for operator safety.

Figure 3:
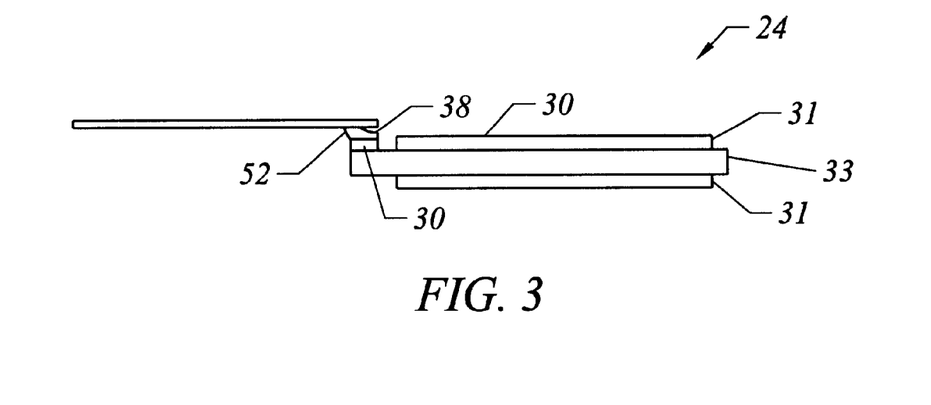
FIG. 3 illustrates a cross-sectional view of a power device with a plastic package delayered according to one embodiment of the present invention.

FIG. 3 depicts a simplified side view of the power device 24 with the plastic encapsulant removed. For purposes of illustration, the device 24 is illustrated as a device satisfying (or being compatible with) a TO-247 package standard. However, the device 24 is not limited to such a package standard. For example, the device 24 may meet the package standards of TO 220, TO 264, SOT 227B, and others. Those skilled in the art will appreciate that the TO-247 package is a Joint Electronic Device Engineering Council ("JEDEC") standard package configuration that is often used with power semiconductor die to produce packaged power semiconductor devices.

Referring back to FIG. 3, the center lead 38 is provided with a bent 52, so that a portion of the lead 38 may be bonded to the first copper layer 30 while maintaining the other two leads 37 and 39 above the first copper layer. The other two leads are electrically coupled to the different terminals of the die. The encapsulant (not shown) provides mechanical support for the leads. In addition, edges 31 of the first and second copper layers are set back from an edge 33 of the ceramic layer 33 to ensure better electrical isolation of the two copper layers.

Figure 4:
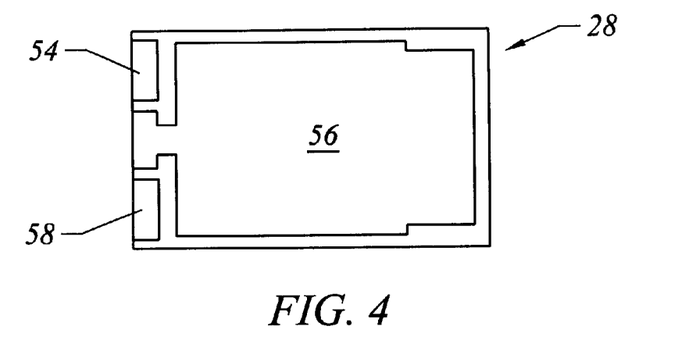
FIG. 4 illustrates a top plan view of a direct bonded metal substrate according to one embodiment of the present invention.
Figure 5:
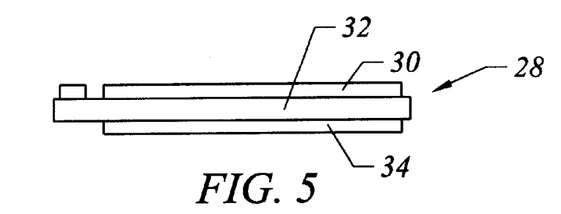
FIG. 5 illustrates a cross-sectional view of the direct bonded metal substrate of FIG. 4.

FIG. 4 depicts a top plan view of the direct bonded metal substrate 28 of the device 24, and FIG. 5 depicts a cross sectional view of the direct bonded metal substrate 28, according to one embodiment of the present invention. The direct bonded metal substrates provide superior thermal conductivity due to its "eutectic bond" between the conductive layers and the dielectric layer.

In the present exemplary embodiment, the substrate 28 is a DCB substrate with alumina as the dielectric layer 32. The dielectric layer could be other material, such as aluminum nitride, beryllia (BeO), or other insulating material compatible with direct bonded metal substrate fabrication. One or both of the copper layers may be tinned or plated.

However, these thickness are given merely as examples, and thicker or thinner layers could be used in other embodiments. The first conductive layer 30, e.g., a copper layer, is patterned to have a plurality of conductive islands or blocks 54, 56, and 58, whereon a plurality of bonding portions of the leads 37, 38, and 39 are bonded as shown in FIG. 2.

Figure 6:
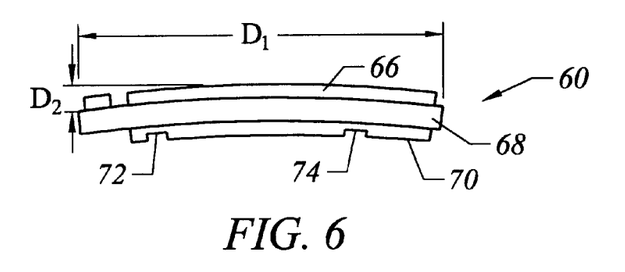
FIG. 6 illustrates a cross-sectional view of a direct bonded metal substrate having a curved surface according to one embodiment of the present invention.

Referring to FIG. 6, in one embodiment, a direct bonded metal substrate 60 having a curved surface is used to fabricate the device 24 in order to provide a power device having an optimal backside shape for purposes of dissipating heat. Such an optimal backside shape may be slightly different for different power devices or even for the same type of power devices used in different environments. In some instances, a desired backside shape of the power device may be a flat surface, whereas in other instances it may be a slightly curved surface. Also the magnitude of the curvature also may be adjusted to provide an optimal backside shape.

Figure 7:
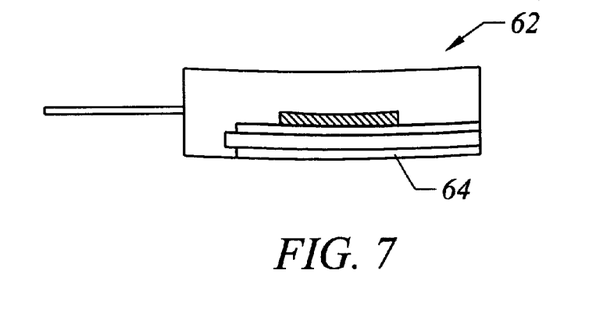
FIG. 7 illustrates a cross-sectional view of a power device having a curved backside.

Among other methods, a direct bonded metal substrate, such as the DCB 60, with a particular surface curvature may be used to configure the shapes of the backsides of power devices to a desired specification. For example, where a power device having a flat backside is desired, the inventor has discovered that the power device may be provided with an unwanted curved surface at its backside if a flat DCB substrate is used for the device. The plastic package molding step is performed generally in a temperature at about 175° C. or more by injecting molten plastic polymer into a mold wherein the device is placed. The molten plastic polymer flows around the device and forms a hard solid encapsulant, such as the encapsulant 36 of FIG. 1, as the plastic cools down. During this cooling period, the plastic shrinks at a higher rate than the DCB substrate due to their thermal expansion coefficient differences. As a result, a power device having a curved backside, such as a power device 62, may be provided (FIG. 7). The curvature at a backside 64 of the power device may reduce thermal conductivity of the device since the entire surface area of the backside may not be joined to a heatsink to dissipate power generated by the device.

Accordingly, in one embodiment, the curved substrate 60 is used to fabricate the power device 24 having a flat backside. The curved substrate 60 has a first conductive layer 66, a second dielectric layer 68, and a third conductive layer 70. The substrate 60 has a length $D_1$ and a pitch $D_2$, where the pitch $D_2$ represents a vertical distance between an edge of the first conductive layer and a center of the first conductive layer. In one embodiment, the pitch $D_2$ ranges from 0.0005 to 0.015 inch, or 0.005 to 0.010 inch, or 0.001 to 0.003 inch, or 0.001 to 0.003 inch. Alternatively, the pitch $D_2$ is between $0.001 \times D_1$ to $0.073 \times D_1$, preferably about $0.0017 \times D_1$ to $0.005 \times D_1$.

Distance of the pitch may be by varied by controlling the thickness of the conductive layer 32 or 34, e.g., the pitch increases with the thickness of the copper layer. In one embodiment, the thickness of one or both copper layers is adjusted to obtain a desired pitch. Distance of the pitch may also be varied by providing patterns on one or both conductive layers. For example, the conductive layer 70 is provided with patterns 72 and 74 to form the pitch $D_2$. Using these and other methods, the extent of the pitch $D_2$ may be varied to accordingly to offset the effects of the molding step and obtain a power device having a substantially flat backside (FIG. 1).

Figure 8:
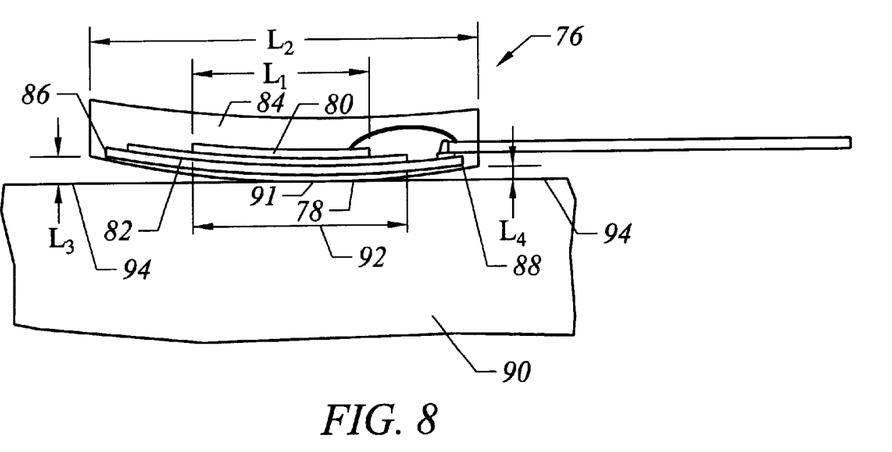
FIG. 8 illustrates a cross-sectional view of a power device having a curved backside according to one embodiment of the present invention.

Referring to FIG. 8, in another embodiment, a power device 76 having a curved (or convex) backside 78 may be desired. The power device 76 includes a semiconductor die 80 provided over a direct bonded metal substrate 82, which are enclosed in an encapsulant or plastic package 84. The backside 78 of the device includes a lower conductive layer of the substrate 82 and a lower surface of the package 84. The die 80 has a length $L_1$, and the package 84 has a length $L_2$. The device or package has a pitch $L_3$ on a first end 86 of the device, and a pitch $L_4$ on a second end 88 of the device. These two pitches may be substantially the same or different. The power device is be securely attached to a heatsink 90 having a flat surface 91 using a mounting clip (not shown), a screw (not shown), or the like.

In one embodiment, a portion 92 of the backside 78 directly below the die is substantially flat and in contact with the heatsink 92 to dissipate heat generated by the device. The pitch $L_3$ is defined as a vertical distance from a lower surface of the end 86 to an imaginary horizontal line 94 defined by the flat surface 91 of the heatsink. Similarly, the pitch $L_4$ is defined as a vertical distance from a lower surface of the end 88 to the imaginary horizontal line 94 defined by the flat surface 91 of the heatsink.

During the operation of the power device 76, the heat generated by the power device 76 expands the plastic package 84 and bends the ends 86 and 88 of the device toward the heatsink 90. Accordingly, the power device 76 is provided with a substantially flat backside whose entire surface is clamped to the heatsink to enable better heat dissipation. In one embodiment, for smaller packages (e.g., TO-247) one or both of the pitch $L_3$ and $L_4$ are no more than about 0.002 inch (0.0508 mm), preferably no more than about 0.001 inch (0.0254 mm). For larger packages (e.g., TO-264 or SOT-227), one or both of the pitch $L_3$ and $L_4$ are no more than about 0.004 inch (0.118 mm), preferably no more than about 0.002 inch (0.0508 mm). Alternatively, the pitch $L_3$ and $L_4$ may be defined in terms of the package length $L_2$. For example, $L_3$ is less than or equal to $0.002 \times L_2$, preferably less than or equal to $0.001 \times L_2$, and $L_4$ is less than or equal to $0.002 \times L_2$, preferably less than or equal to $0.001 \times L_2$. Alternatively, $L_3$ is less than or equal to $0.0008 \times L_2$, preferably less than or equal to $0.0005 \times L_2$, and $L_4$ is less than or equal to $0.0007 \times L_2$, preferably less than or equal to $0.0005 \times L_2$.

Figure 9:
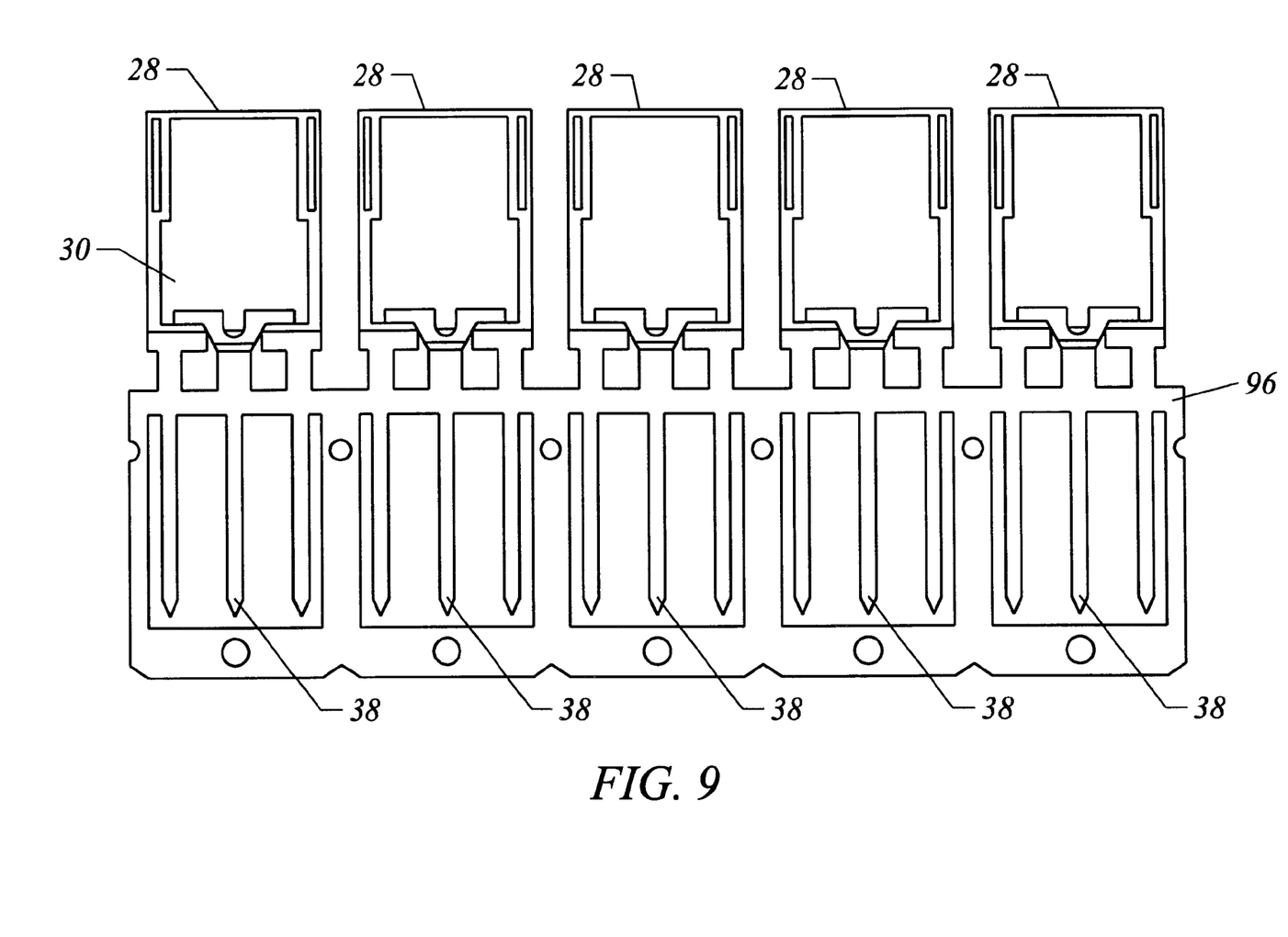
FIG. 9 illustrates a top plan view of a lead frame according to one embodiment of present invention.

FIG. 9 is a simplified top view of a lead frame 96 with a plurality of the DCB substrates 28, 60. The copper lead frame 96 is made from alloy 194, TAMAC-4, or equivalent. The center leads 38 are soldered to the first copper layer 30 of the DCB substrates. After die attach and wire bonding, a plurality of unencapsulated devices will be cut from the lead frame using a trimming tool or other means, as are known in the art.

A molding press is loaded with unencapsulated devices and plastic encapsulant is heated and formed around the device in accordance with the appropriate package specification, if any. The yield through the encapsulation process is higher, for DCB packaged devices than if similar devices with bare ceramic substrates were encapsulated. Use of a DCB substrate reduces cracking of both the substrate and the semiconductor die. Cracking of the substrate is reduced because the composite DBC structure provides support for the ceramic layer. Cracking of the semiconductor die is also reduced because the thermal expansion coefficient of copper more closely matches that of silicon than does the thermal expansion coefficient of typical ceramics.

Furthermore, using a bare ceramic substrate for a packaged power semiconductor device typically increases costs and reduces thermal performance compared to a DCB packaged power semiconductor device according to one embodiment of the present invention. First, in order to attach the die to a ceramic substrate, a die attach pad is usually provided. This is often done by silk-screening a metal-glass frit onto the ceramic substrate and firing the frit. The metal in the frit is usually an expensive noble metal, and the screening and firing process results in additional yield loss. Second, the thermal performance of a package with a bare ceramic substrate is inferior to the DCB package.

The die-side or first copper layer of the DCB package serves as a heat-spreading layer to basically increase the heat-transfer area from the "footprint" of the semiconductor die out to nearly the entire DCB substrate area, i.e., the area of 30 the die-side copper layer. For a given thickness of ceramic, which typically has higher thermal resistance than copper, a larger heat-transfer area will provide superior heat transfer across the high-resistance layer, as those skilled in the art will appreciate.

The back-side or second copper layer also improves the thermal performance of the DCB package in a number of ways. Although the die-side copper layer spreads the heat from the die, the temperature in the vicinity of the die ("underneath" the die) will be higher than the temperature at the edge of the die-side copper layer. The extent of this heat gradient depends on many factors; however, the back-side copper layer serves to spread the heat transferred across the ceramic layer and reduce the formation of a hot-spot underneath the die. Heat spreading from both copper layers also reduces heat-related stress and resultant cracking of the substrate and/or die, thus improving reliability.

Additionally, the direct-bonding process intimately attaches the copper to the ceramic, providing for excellent thermal conduction from one layer to the next. This thermal conduction is better than typically occurs when contacting a bare ceramic substrate against a heatsink. The high thermal resistance of the ceramic impedes lateral heat spreading, so that each microscopic contact point with the heatsink becomes a hot-spot, while the heat-conductivity of the back-side copper layer provides good lateral heat conduction, reducing the consequences of localized contact with the heatsink. Finally, the back-side copper layer allows the DBC packaged device to be soldered to a heatsink, thermally coupling the entire area of the back-side layer to the heatsink.

Even if the back side of a ceramic substrate were coated with frit and fired, the thermal performance would not equal that of the DBC packaged device, as the metal-glass (matrix of the fired frit does not conduct heat as well at the copper layer of the DBC packaged device. Therefore, the DBC packaged power device can thermally couple to a heatsink while providing electrical isolation.

Figure 10A:
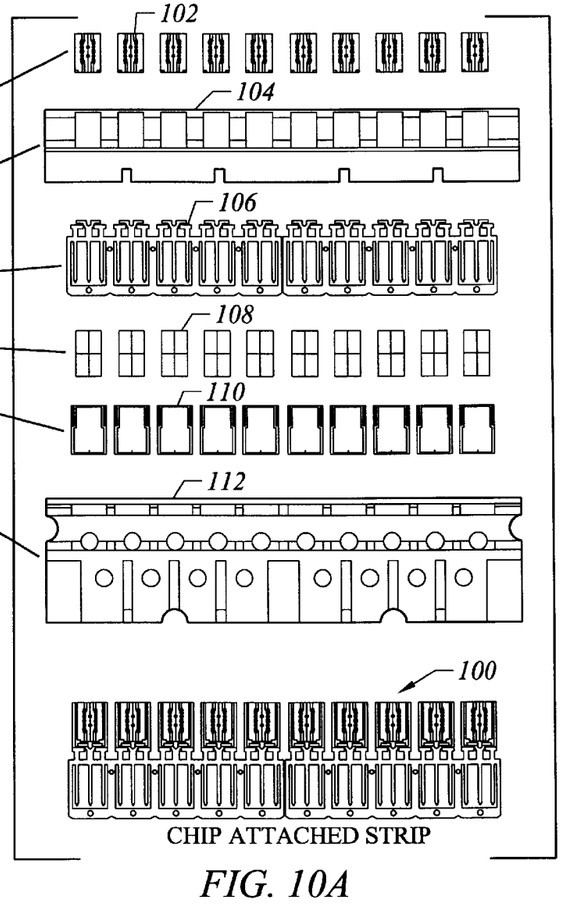
FIG. 10A illustrates a top exploded view of components and tools used to manufacture a power device according to one embodiment of the present invention.
Figure 10B:
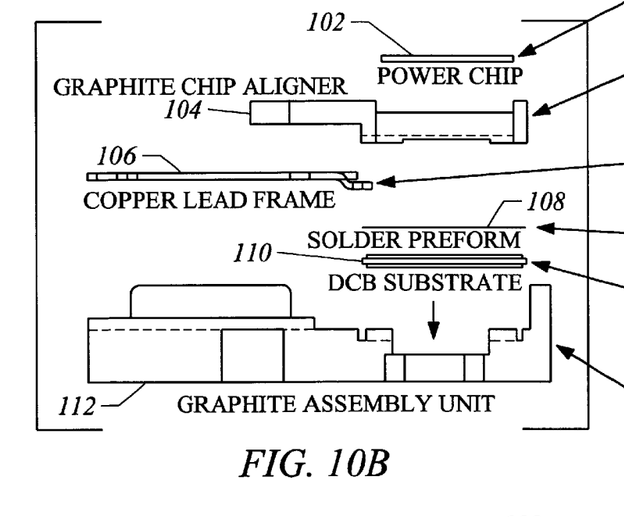
FIG. 10B illustrates a side exploded view of components and tools used to manufacture a power device according to one embodiment of the present invention.
Figure 10C:
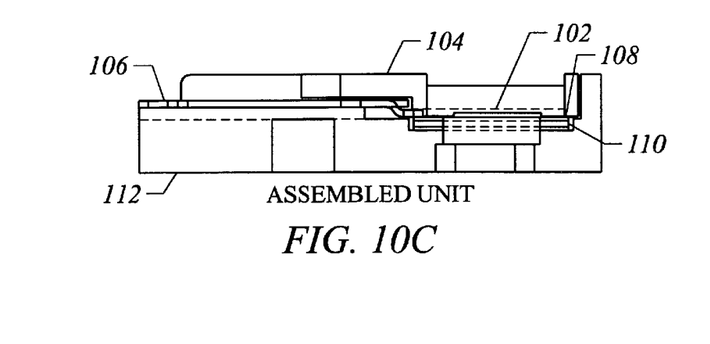
FIG. 10C illustrates a side view of an assembly boat and components for simultaneously soldering semiconductor dice and leads to substrates according to one embodiment of the present invention.

FIGS. 10A–10C illustrate an assembly procedure for attaching leads and dice to DCB substrates in a single soldering operation. FIG. 10A is an exploded top view of the piece parts used to fabricate a chip-attached strip 100 that will be used to fabricate a number of TO-247 packaged isolated power semiconductor devices, as an example. Other package configurations could be used in the assembly process, such as the TO-220 or TO-264 style packages, with appropriate modification of the tooling and other components. The components and tools include power semiconductor dice (chips) 102, a chip aligner tool 104, made from graphite, a copper lead frame 106, solder preforms 108, DBC substrates 110, and an assembly boat 112, also made from graphite. The chip aligner tool and assembly boat could be made with other material compatible with the intended assembly process, such as alumina, quartz, boron nitride, or others.

FIG. 10B is an exploded side view of the components and tools, and FIG. 10C is the assembled unit with the chip aligner tool 104 and the assembly boat 112 holding the power semiconductor die 102 and the copper lead frame 106 in proper alignment to the DCB substrate 110 and solder preform 108.

Figure 11:
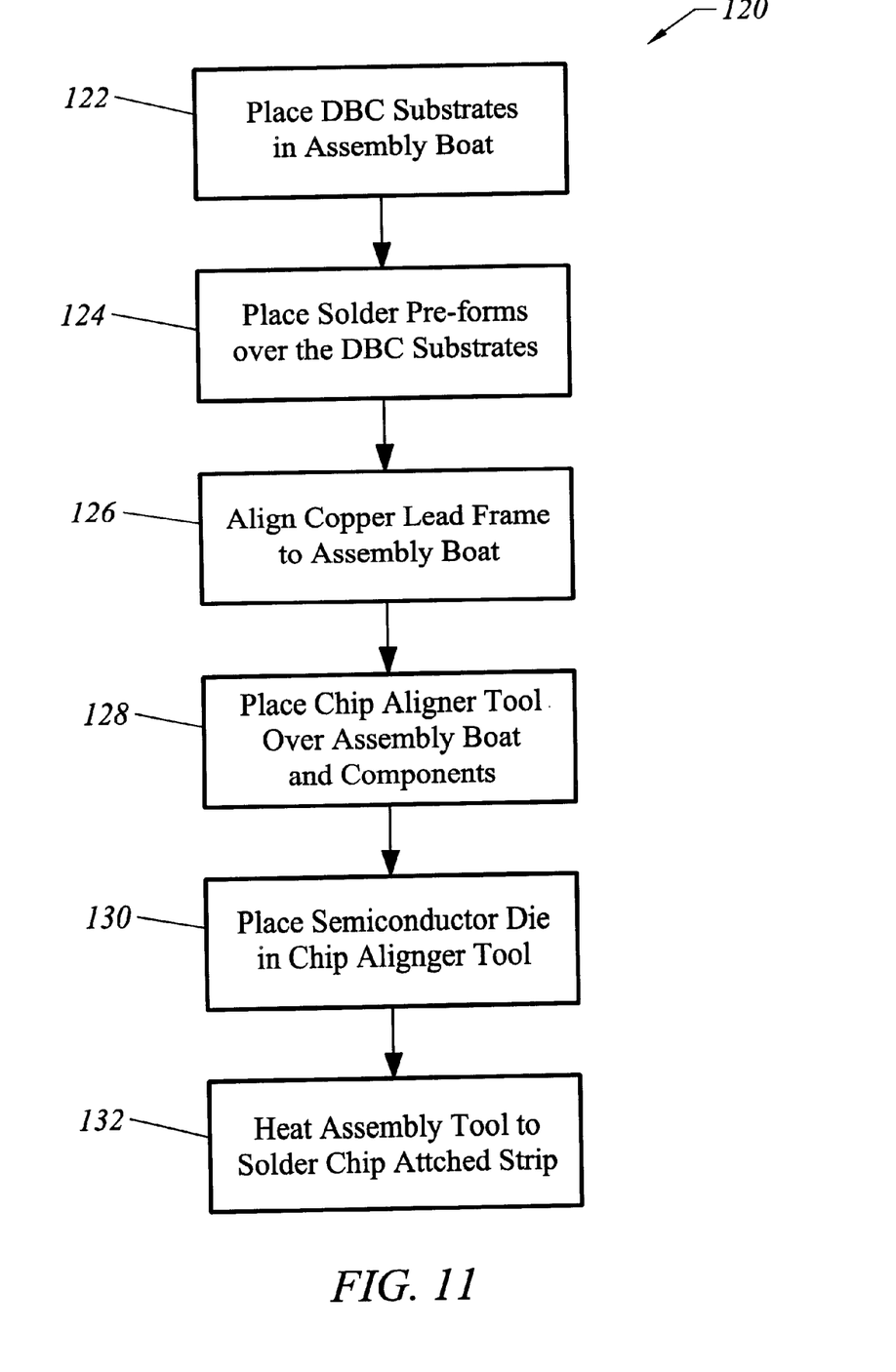
FIG. 11 shows a flow chart of an assembly process of a power device according to one embodiment of the present invention.

FIG. 11 is a flow diagram for an assembly process 120 of a TO-247 chip-attached strip according to one embodiment of the present invention. The DCB substrates are placed in machined pockets in the assembly boat (step 122). The DCB substrate may or may not have a curved surface according to one embodiment of the present invention. The solder preforms are placed over the DCB substrates (step 124). The copper lead frame is placed in a separate machined pocket to align the contact pads of the lead frame to the contact pads of the patterned die-side copper layer of the DCB substrate (step 126). The chip aligner tool is placed over the assembly boat, further holding the leads in proper alignment to the DCB substrate (step 128), and the power semiconductor dice are placed in pockets in the chip aligner tool that align the chip to the DCB substrate (step 130). The assembly is then heated to melt the solder and to concurrently solder the copper lead frame and power semiconductor dice to the DCB substrates (step 132). The solder process is typically carried out in a single pass in a reflow belt furnace in a reducing atmosphere, thus eliminating the need for a solder flux, as is known in the art, but other furnaces or heat sources could be used.

Additionally, the chip could be attached to the DCB substrate in one operation and the leads attached in another, such as using a high-temperature solder or braze, or eutectic die attach, for the chip attach, and another solder, spot-weld, or similar operation for the lead attach. DCB substrates could be attached to lead frames, and these subassemblies could be shipped to an assembly facility, where the semiconductor dice would be attached and the wire-bonding and encapsulation performed. Normally, the first attachment process, whether it be used to attach the leads or the dice, results in an attachment that is reliable at the temperature of the second attachment process.

In one embodiment, the solder preform is a sheet of solder that is oversized in comparison to the DCB substrate 30 When the solder melts, it wets only the metal parts of the assembly, thus leaving the ceramic portions of the substrate and the assembly tools bare of solder.

Alternatively, the chip aligner tool is not necessary if power semiconductor dice have solder pre-applied to the back of the dice. In that instance, the dice will self-align to the right spot on the DCB substrate. Self-alignment may be facilitated by patterning the die-side copper layer in accordance with the footprint of the intended semiconductor die. Alternatively, automated die placement or die bonding equipment can be used to place each die on the DBC substrate.

Figure 12A:
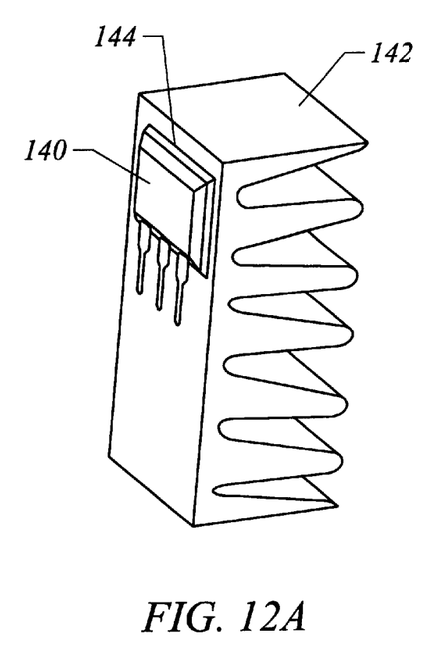
FIG. 12A shows a simplified view of a power device soldered to a heatsink according to one embodiment of the present invention.
Figure 12B:
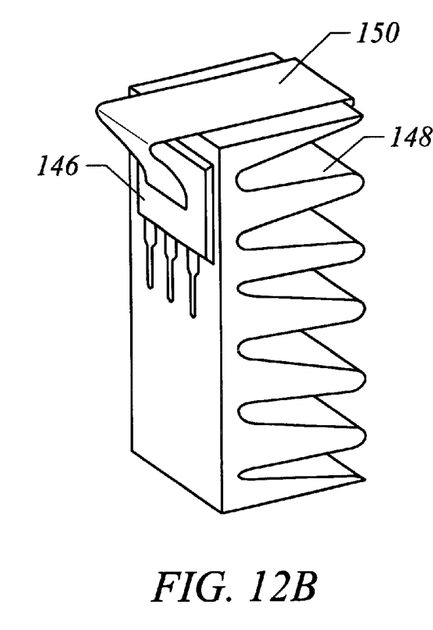
FIG. 12B shows a simplified view of a power device clipped to a heatsink according to one embodiment of the present invention.

FIG. 12A is a simplified view of a DCB packaged power semiconductor device 140 solder bonded to a heatsink 142, as indicated by a solder layer 144. Alternatively, the DCB packaged power semiconductor device could be clipped, screwed, bolted, or otherwise attached to the heatsink. FIG. 12B is a simplified side view of a DCB power semiconductor device 146 attached to a heatsink 148 with a clip 150. The clip is metal, such as spring steel or beryllium-copper, or plastic.

FIGS. 13A–13D illustrate a power device 200 having SOT class of packages ("SOT power device"), e.g., SOT 227, SOT 227B, as described in the patent application entitled, "Power Device with a Plastic Molded Package and Direct Bonded Substrate," assigned to the assignee of the present application and filed in the U.S. Patent and Trademark Office concurrently with the present application (Attorney Docket 011775-007931US), which is incorporated by reference for all purposes. Such a power device has a higher power semiconductor than typical single in-line packaged devices such as TO-220, TO-247, and TO-264. Those skilled in the art will appreciate that the SOT class of packages and TO class of package are Joint Electronic Device Engineering Council ("JEDEC") standard package configurations that are often used with power semiconductor die to produce packaged power semiconductor devices.

Generally, SOT power devices are configured to handle blocking voltages from 70 to 1000 volts, output currents from 36 to 340 amperes, and output power from 500 to 700 watts. Alternatively, they may handle blocking voltages of up to 1500 volts, or even up to 2000 volts or more. As used herein, the term "SOT power device" refers to any power device that is compatible with the SOT class of packages as listed above or a power device having a plurality of leads overlying a top surface of the power device. As used herein, the term "SOT 227" refers to SOT 227 or any other variation or version of SOT 227 including SOT 227B.

Figure 13A:
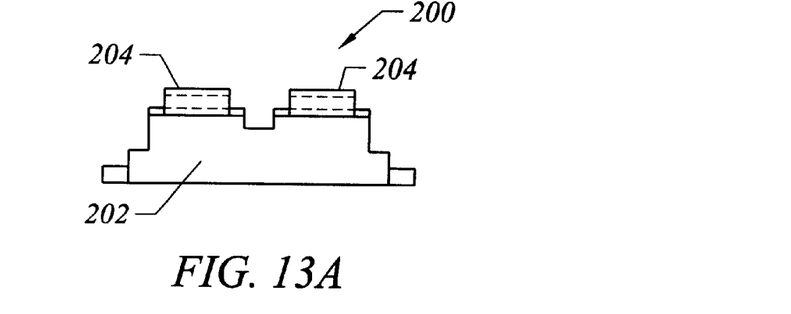
FIG. 13A illustrates a first side elevational view of an SOT power device according to one embodiment of the present invention.
Figure 13B:
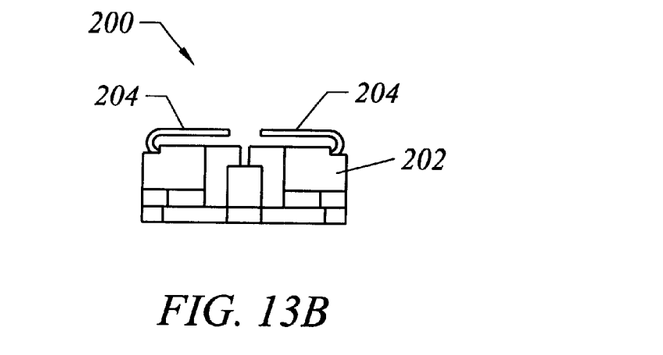
FIG. 13B illustrates a second side elevational view of the SOT power device of FIG. 13A, wherein the second side view is in an orthogonal direction to the first side view.
Figure 13C:
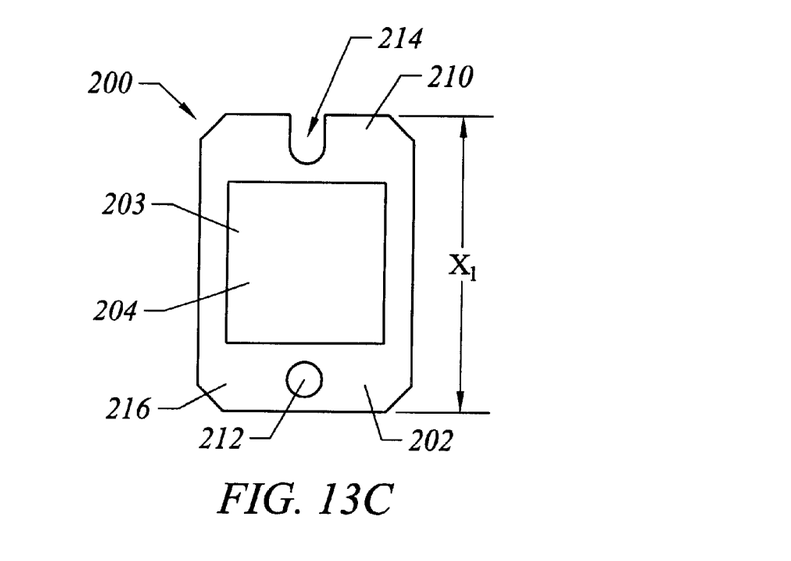
FIG. 13C illustrates a bottom plan view of the SOT power device of FIG. 13A.

As shown in the figures, the power device 200 has a plastic package 202 and a direct bonded metal substrate 204 according to one embodiment of the present invention. In one embodiment, the substrate 204 uses alumina rather than aluminum nitride as its ceramic substrate. FIG. 13A shows a first side elevational view of the device, and FIG. 13B shows a second side elevational view of the device, where the first and second side views are views with 90 degree shifts from each other. FIG. 13C shows a bottom plan view of the device 200 including the plastic package 202 and a backside of the direct bonded metal substrate 204, which may be copper, aluminum or other conductive metal, as explained in greater detail later. The device 200 has a length $X_1$, about 1.496 inch in one embodiment of the present invention.

Figure 13D:
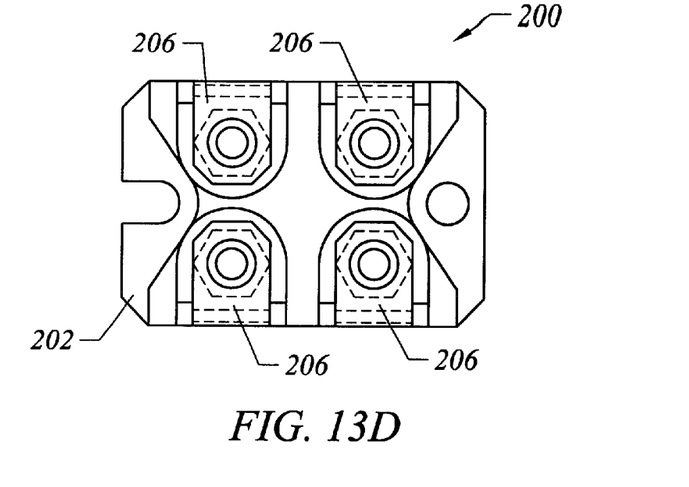
FIG. 13D illustrates a top plan view of the SOT power device of FIG. 13D.

The plastic package includes a first extension 210 extending outwardly from the direct bonded metal substrate in a first direction and a second extension 212 extending outwardly from the direct bonded metal substrate in a second direction that is in opposite direction from the first direction. The first and second extensions are plastic and have holes 214 and 216 extending through the extensions to facilitate mounting of the device 200 to another device, e.g., a heatsink. The holes 214 and 216 are configured to receive screws, bolts, nails, or the like. FIG. 13D shows a top plan view of the device, where the leads are overlying a top surface of the device 200.

When seen externally, the device 200 includes the plastic package 202, a backside (or lower surface) of the direct bonded metal 204, and a plurality of leads 206 extending outwardly from the package. Generally, a lower surface or backside of the plastic package 202 is flushed to the backside of the direct bonded metal 204. In another embodiment, the backside of the direct bonded substrate 204 may extend slightly below the backside of the package 202. Although not seen from outside, the device 200 includes, as in the device 24, a semiconductor die (not shown) enclosed within the package 202 to regulate electrical current.

In one embodiment, the device 200 is designed to operate at about 70 to 1000 volts ($V_{DS}$), generate current ($I_{DS}$) of about 30 to 350 amperes, and handle output power of about 500 to 700 watts. In another embodiment, the device 200 is designed to operate up to 1500, 2000, or 3000 volts ($V_{DS}$) and generate current ($I_{DS}$) up to 400, 500, or 1000 amperes. In one embodiment, the device 200 is a discrete device having a single semiconductor die enclosed within the package.

Figure 14A:
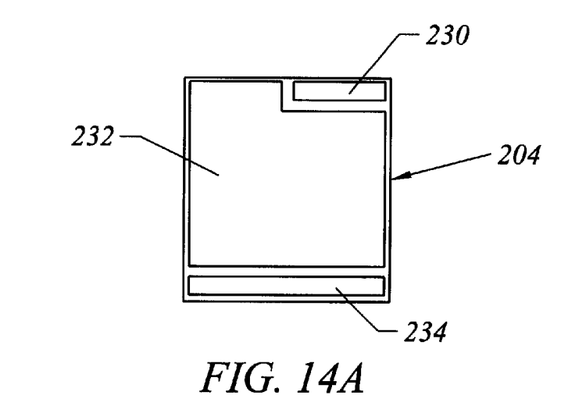
FIG. 14A illustrates a top plan view of a direct bonded metal substrate according to one embodiment of the present invention.
Figure 14B:
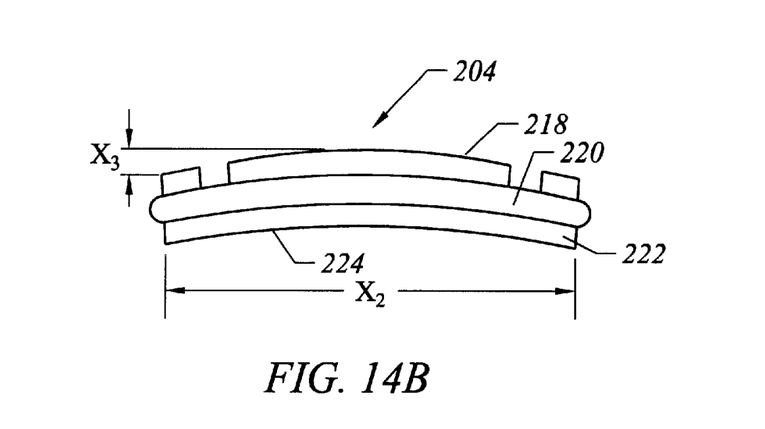
FIG. 14B illustrates a cross-sectional view of the direct bonded metal substrate of FIG. 14A.

FIG. 14A depicts a top plan view of the direct bonded metal substrate 204 of the device 200, and FIG. 14B depicts a cross sectional view of the direct bonded metal substrate 204, according to one embodiment of the present invention. The direct bonded metal substrate 204 has a first conductive (front side) layer 218 that is bonded to a second dielectric layer 220, typically of ceramic material, that is in turn bonded to a third conductive (backside) layer 222. As used herein, the term "first and third conductive layers" also may be referred to as "first and second conductive layers," or vice versa. In one embodiment, the substrate 204 has a curved backside 224 to provide the device 200 with a flat or curved backside, explained in connection with the device 24. In another embodiment, the device 200 uses a direct bonded metal substrate having a flat backside to obtain a curved backside.

The direct bonded metal substrate may be a direct copper bonded (DCB) or direct aluminum bonded (DAB) substrate. The DCB substrates have copper as the first and second conductive layers, and the DAB substrates have aluminum as the first and second conductive layers. In one embodiment, the substrate 204 may have different metals for the first and third conductive layers.

Figure 15:
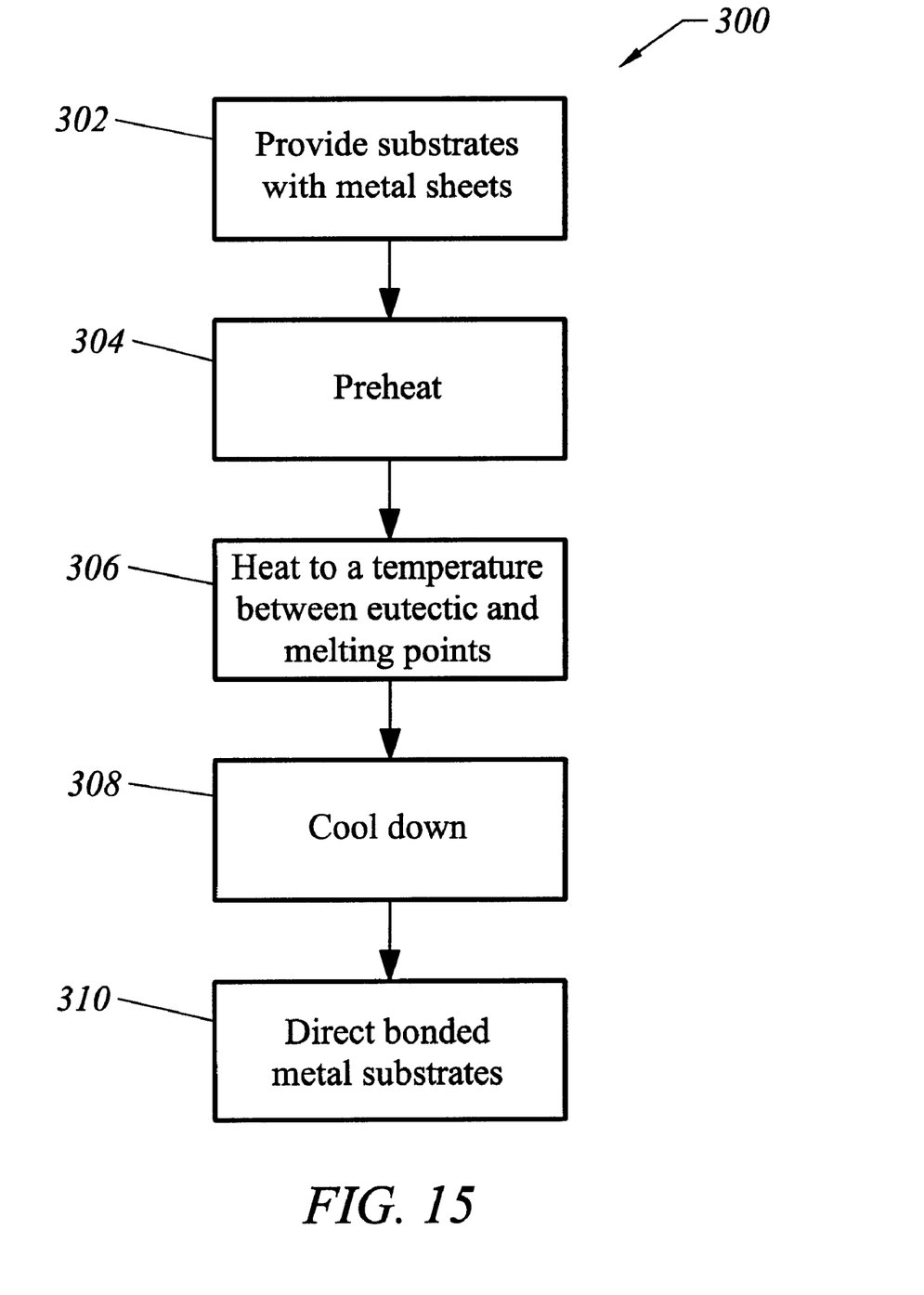
FIG. 15 illustrates a method of manufacturing a direct bonded substrate according to one embodiment of the present invention.

FIG. 15 depicts a method 300 for forming the direct bonded metal substrate 228, e.g., a DBC substrate, according to one embodiment of the present invention. A detailed description of manufacturing the direct bonded metal substrate according to one embodiment is provided in U.S. Pat. No. 4,483,810, which is incorporated by reference for all purposes.

Generally, the method involves placing a conductive or metal layer substrate on a dielectric or ceramic substrate and heating them to a temperature between the eutectic temperature and the melting temperature of the conductive substrate. For example, a metal substrate, e.g., copper, is placed on a ceramic substrate (step 302). In one embodiment, the conductive metal substrate or layer has been patterned to obtain a direct bonded metal substrate having a curved surface. In another embodiment, a selected thickness of the conductive metal layer is used to obtain a direct bonded metal substrate having a curved surface.

A thin oxide layer may be formed over the copper substrate on the side facing the ceramic substrate or on the both sides. The copper and ceramic substrates are placed in a carrier, preferably of silicon carbide or graphite core with a silicon carbide coating, and inserted into a furnace. The copper and ceramic substrates are preheated (step 304). The preheat step is typically performed in a first zone within the furnace to gradually ramp up the temperature of the substrates. The first zone may include a plurality of sub-zones in one embodiment. The temperature within the first zone is kept at no more than about 960° C. in one embodiment of the present invention.

The copper and ceramic substrates are heated to a temperature between eutectic and melting temperatures of copper (step 306). Generally, the substrates are moved into a second zone within the furnace during this step. In one embodiment, the peak temperature within the second zone is less than 1083° C., preferably about 1071° C., to raise the temperatures of the substrates to above the eutectic temperature of copper, which is about 1065° C. As a result a eutectic melt is formed between the copper substrate and the ceramic substrate.

The substrates are cooled to a predetermined temperature to solidify the eutectic melt (step 308). Generally, the substrates are moved to a third zone within the furnace. The solidification of the eutectic melt does not occur instantaneously, and the bonding process is not completed until the temperature drops well below the eutectic temperature, usually about 100° C. below the eutectic temperature. The cooling process generally involves two or more steps to gradually ramp down the temperature during a period of about 20 minutes. The resulting product is a direct bonded copper substrate, such as the DBC substrate 204 (step 310).

While the invention has been particularly shown and described with reference to a specific embodiment thereof, it will be understood by those skilled in the art that the foregoing and other changes in the form and details may be made therein without departing from the spirit or scope of the invention. For example, embodiments of the present invention may bed used to in connection with a high frequency RF power device, as disclosed in U.S. patent application Ser. No. 09/992,602, filed on Nov. 13, 2001, which is incorporated by reference, to provide the device with a flat or curved backside. Therefore, the scope of this invention should not be limited to the embodiments described above, and should instead be defined by the following claims.

What is claimed is:

1. A packaged power device, comprising:
a substrate including a first conductive layer, a second dielectric layer, and a third conductive layer, the first conductive layer being bonded to the second dielectric layer, and the second dielectric layer being bonded to the third conductive layer, the first and third conductive layers being electrically isolated from each other, the substrate having a lower surface;
a semiconductor die being bonded to the first conductive layer of the substrate;
a plastic package enclosing the die and having a lower surface; and
a curved backside including the lower surfaces of the plastic package and substrate.

2. The device of claim 1, wherein the curved backside of the device is attached to a heatsink to dissipate power generated by the power device, the curved backside of the device being configured to expand toward the heatsink during the operation of the power device, so that heatsink is in contact substantially with the entire backside of the power device.

3. The power device of claim 1, wherein the backside of the power device includes a center portion directly underlying the die, a first outer portion extending outward from the center portion in a first direction and a second outer portion extending outward from the center portion in a second direction, wherein the center portion of the backside is substantially flat.

4. The power device of claim 3, wherein the center portion of the curved backside of the device overlies flatly against a heatsink to dissipate power generated by the power device, and the first and second outer portions of the backside are provided above the heatsink without contacting the heatsink.

5. The power device of claim 4, wherein the power device is clipped or screwed to the heat sink.

6. The power device of claim 4, wherein the power device is solder bonded to the heat sink.

7. The power device of claim 6, wherein the center portion of the backside is solder bonded to the heatsink and the first and second outer portions are not solder bonded to the heatsink.

8. The power device of claim 1, wherein the substrate is a direct bonded metal substrate.

9. The power device of claim 1, wherein the substrate is a direct copper bonded substrate, wherein the first and third conductive layers are copper layers.

10. The power device of claim 1, wherein the substrate is a direct aluminum bonded substrate, wherein the first and third conductive layers are aluminum layers.

11. The power device of claim 10, wherein the second dielectric layer is $Al_2O_3$.

12. The power device of claim 1, wherein the package has a length N1 and the backside has a pitch N2, wherein the pitch N2 is no more than 0.002×N1.

13. The power device of claim 1, wherein the pitch is a vertical distance from a center of the backside to an edge of the backside.

14. The power device of claim 1, wherein the backside has a pitch that is no more than 0.001 inch.

15. A power device, comprising:
a direct bonded metal substrate having a first conductive layer, a second dielectric layer, and a third conductive layer;
a semiconductor die bonded to the first conductive layer of the substrate; and
a plastic package having a lower surface and substantially enclosing the die and exposing a lower surface of the second conductive layer, wherein a backside of the device has a curved surface.

16. The power device of claim 15, wherein the backside of the device has a pitch of no more than about 0.002 inch.

17. The power device of claim 15, wherein the device conforms to a TO-247 package standard.

18. The power device of claim 17, wherein the backside of the device has a pitch of no more than about 0.001 inch.

19. The power device of claim 15, wherein the direct bonded metal substrate is a direct aluminum bonded substrate.

20. The power device of claim 15, wherein power device satisfies SOT 227 package standard.

21. The power device of claim 15, wherein the third conductive layer has a pattern to provide the substrate with a curved surface.

22. The power device of claim 15, wherein the first and third conductive layer has different thickness to provide the substrate with a curved surface.

* * * * *